United States Patent
Ritland et al.

(10) Patent No.: US 6,270,601 B1
(45) Date of Patent: Aug. 7, 2001

(54) METHOD FOR PRODUCING FILLED VIAS IN ELECTRONIC COMPONENTS

(75) Inventors: Marcus A. Ritland; Steven M. Landin, both of Golden, CO (US)

(73) Assignee: CoorsTek, Inc., Golden, CO (US)

( * ) Notice: Subject to any disclaimer, the term of this patent is extended or adjusted under 35 U.S.C. 154(b) by 0 days.

(21) Appl. No.: 09/184,790

(22) Filed: Nov. 2, 1998

(51) Int. Cl.$^7$ ........................................ B32B 31/00
(52) U.S. Cl. ......................... 156/89.12; 156/89.17; 156/89.18; 156/252; 156/272.8; 156/293; 427/97
(58) Field of Search ............... 156/89.12, 89.17, 156/89.18, 252, 272.8, 293; 427/96, 97; 29/850, 851, 852; 428/131, 134, 210, 901; 264/614, 619

(56) References Cited

U.S. PATENT DOCUMENTS

| | | |
|---|---|---|
| 3,310,427 | 3/1967 | Cheney et al. . |
| 3,949,804 | 4/1976 | Kaneko et al. ..................... 164/62 |
| 4,810,528 * | 3/1989 | Kondo et al. ..................... 427/96 |
| 4,824,622 | 4/1989 | Kennedy et al. ..................... 264/59 |
| 4,828,008 | 5/1989 | White et al. ..................... 164/66.1 |
| 4,833,039 * | 5/1989 | Mitoff et al. . |
| 4,849,266 | 7/1989 | Dwivedi et al. ..................... 428/34.4 |
| 4,853,352 | 8/1989 | Newkirk et al. ..................... 501/88 |
| 4,935,055 | 6/1990 | Aghajanian et al. ............... 164/66.1 |
| 4,942,076 | 7/1990 | Panicker et al. . |
| 5,000,246 | 3/1991 | Dwivedi et al. ..................... 164/97 |
| 5,000,247 | 3/1991 | Burke ..................... 164/97 |
| 5,004,034 | 4/1991 | Park et al. ..................... 164/97 |
| 5,004,035 | 4/1991 | Burke et al. ..................... 164/97 |
| 5,005,631 | 4/1991 | Dwivedi ..................... 164/97 |
| 5,007,475 | 4/1991 | Kennedy et al. ..................... 164/97 |

(List continued on next page.)

OTHER PUBLICATIONS

U.S. application No. 08/820,164, filed Mar. 19, 1997, Ritland et al.

U.S. application No. 08/949,227, filed Oct. 13, 1997, Ritland et al.

Chaklader et al., "Interface Reactions Between Metals and Ceramics:IV, Wetting of Sapphire by Liquid Copper–Oxygen Alloys" Dept. of Metallurgy, Univ. of British Columbia, Vancouver, British Columbia, Canada (Date and publication unknown).

Goetzel, "Infiltration," *Metals Handbook*, (Power Metallurgy)7:551–566 (1984).

Maxwell, et al., 1990, *Metallurgical Transaction B*, 21B:475–485.

Naidich, 1981, *Prog. in Surf & Membrane Sc.*, pp. 353–485.

O'Brien et al., 1974, *J. of the Amer. Ceramic Society*, 57:329–332.

Seitz, et al., 1989, *Interfaces in Metal–Ceramics Composites, The Minerals, Metals and Materials Society*, pp. 197–212.

Zong, et al., 1993, *J. of the Amer. Ceramics Society, Equilibrium Phase Diagrams in the Systems PbO–Ag and CuO–Ag*, pp. 2663–2664.

*Primary Examiner*—Curtis Mayes
(74) *Attorney, Agent, or Firm*—Sheridan Ross P.C.

(57) ABSTRACT

The present invention relates to a process for producing filled vias which are made of two components, a first component which forms a bonding layer between the wall of the via and a second component which forms the core of the via. Preferably, the two components solidify from a melt which includes two immiscible liquids. The first liquid is capable of wetting the wall of the via and the second liquid. The resulting product is also disclosed. Preferably the first component comprises a copper oxide and the second component comprises a conductive metal such as silver or copper.

20 Claims, 3 Drawing Sheets

U.S. PATENT DOCUMENTS

| | | | |
|---|---|---|---|
| 5,011,725 | 4/1991 | Foster | 428/137 |
| 5,016,703 | 5/1991 | Aghajanian et al. | 164/97 |
| 5,017,533 | 5/1991 | Newkirk et al. | 501/127 |
| 5,020,584 | 6/1991 | Aghajanian et al. | 164/97 |
| 5,029,242 * | 7/1991 | Sammet | 427/97 X |
| 5,040,588 | 8/1991 | Newkirk et al. | 164/97 |
| 5,087,396 * | 2/1992 | Zablotny et al. . | |
| 5,089,881 | 2/1992 | Newkirk et al. | 167/97 |
| 5,161,728 | 11/1992 | Li | 228/124 |
| 5,163,499 | 11/1992 | Newkirk et al. | 167/96 |
| 5,203,488 | 4/1993 | Wang et al. | 228/122 |
| 5,215,610 * | 6/1993 | DiPaolo et al. . | |
| 5,229,213 * | 7/1993 | Horiuchi et al. | 428/901 X |
| 5,229,549 * | 7/1993 | Yamakawa et al. | 428/901 X |
| 5,238,045 | 8/1993 | Park et al. | 164/97 |
| 5,248,079 | 9/1993 | Li | 228/121 |
| 5,249,621 | 10/1993 | Aghajanian et al. | 164/97 |
| 5,267,601 | 12/1993 | Dwivedi | 164/97 |
| 5,294,567 * | 3/1994 | Dorfman et al. . | |
| 5,337,475 * | 8/1994 | Aoude et al. | 29/852 |
| 5,340,947 | 8/1994 | Credle et al. | 174/262 |
| 5,395,701 | 3/1995 | White et al. | 428/614 |
| 5,454,927 * | 10/1995 | Credle et al. . | |
| 5,454,928 * | 10/1995 | Rogers et al. | 427/97 X |
| 5,464,950 * | 11/1995 | Horiuchi et al. . | |
| 5,468,445 * | 11/1995 | Casey et al. . | |
| 5,490,965 * | 2/1996 | Christiansen . | |
| 5,496,619 * | 3/1996 | Itagaki et al. | 428/901 X |
| 5,565,262 * | 10/1996 | Azzaro et al. | 428/210 |
| 5,614,043 | 3/1997 | Ritland et al. | 156/89 |
| 5,681,444 | 10/1997 | Azzaro et al. . | |
| 5,763,093 | 6/1998 | Casey et al. . | |

* cited by examiner

METHOD FOR PRODUCING FILLED VIAS IN ELECTRONIC COMPONENTS

BACKGROUND OF THE INVENTION

1. Field of the Invention

The present invention relates to a method for filling holes in substrates and the resulting products. More particularly, the present invention relates to a method for producing filled vias in ceramic substrates to obtain electronic components.

2. Description of Related Art

The production of filled vias in insulating substrates is an important part of the electronics industry. A particular desirable embodiment includes electrically conductive metal vias formed in electrically insulative ceramic substrates. These substrates can be employed in a number of electronic components. Prior electronic devices have been produced using ceramic substrates, wherein each substrate has a particular screened metal pattern on its planar surface and a selected pattern of feed-through vias, or holes, formed through the sheet. The vias in the ceramic sheets are usually filled in the unfired or "green" state with a slurry of refractory metal paste, i.e., tungsten particles suspended in an organic vehicle. Screen printing techniques, through either a stencil or a screen, are typically used to apply the planar metallization and to force the metallizing paste into the vias.

During the sintering operation, the binder is volatilized from the ceramic sheet, the patterned metallization and the via metallization. After binder removal, the temperature is increased to provide densification by sintering of the ceramic and refractory metal portions of the assembly. The metal-filled vias then become electrical conductors and provide selective electrical interconnection between the various locations on the device.

While most vias in an electronic device are designed to provide electrical interconnection, vias may also be provided to function as thermal pathways for heat generating components that are placed within or on top of the device. Vias can also be included to function as electrical grounds for the components.

One of the drawbacks of screening metals into vias and conductor paths is that the metal pastes represent a significant cost to the manufacturer of the electronic component. Further, metal pastes often contain many volatile organics and other environmentally undesirable constituents that are used to adjust the rheology of the paste. Moreover, the metallized ceramic device must be sintered in a non-oxidizing atmosphere to avoid oxidation of the refractory metal and the vias usually are not dense.

Some techniques have been developed to address one or more of these problems. U.S. Pat. No. 4,942,076 by Panicker et al., issued Jul. 17, 1990, discloses a single-layer ceramic substrate with metal-filled vias that is useful for mounting high-frequency hybrid microcircuits. Panicker et al. use a screening process to place a refractory metal (e.g., tungsten) and binder into vias that are formed in ceramic sheets and then sinter the sheets such that the tungsten-filled vias have 10 to 20 percent porosity. Copper is then screened onto the porous tungsten-filled vias and the sheets are heated in a reducing atmosphere to reflow the copper into the tungsten. The result is a ceramic substrate having a plurality of vias filled with about 85% tungsten and about 15% copper. It is disclosed that the vias are useful for ground connections and for carrying away internally generated heat.

U.S. Pat. No. 5,089,881 by Panicker issued on Feb. 18, 1992, discloses a ceramic-based chip carrier for mounting an IC chip wherein certain vias in the ceramic substrate include a porous refractory metal that has copper metal reflowed into the porosity of the refractory metal. In the process for making the chip carrier, a sintered ceramic substrate is laser-drilled to form vias therein and the vias are thereafter filled with a refractory metal paste and fired in a reducing atmosphere to sinter the refractory metal into a porous mass. Copper is then screened onto the refractory metal-filled vias and is then heated in a reducing atmosphere to reflow the copper into the porous metal. At least three furnace cycles are required. This process is also not a co-fire process wherein the refractory metal and the ceramic are sintered in a single step.

U.S. Pat. No. 5,163,499 by Newkirk et al., issued on Nov. 17, 1992, discloses a method of forming electronic packages by infiltrating a permeable mass of filler material or a preform with molten matrix metal and bonding the infiltrated material to a second material, such as a ceramic or metal. Prior to infiltration the filler material or preform is in contact with a portion of the second material such that after infiltration, the infiltrated material is bonded to the second material to form a sealed electronic package.

U.S. Pat. No. 5,614,043 by Ritland, et al. issued on Mar. 25, 1997 relates to ceramic-based electronic components wherein a portion of the component comprises a metal-infiltrated ceramic. In particular, copper infiltrated ceramic vias are disclosed. The vias are filled with a porous sintered ceramic which is subsequently infiltrated with a molten metal, such as copper. U.S. patent application Ser. No. 08/820,164 filed Mar. 19, 1997 and entitled "Electronic Components Incorporating Ceramic-Metal Composites" by Ritland, et al. is a continuation of U.S. Pat. No. 5,614,043. U.S. patent application Ser. No. 08/949,227 filed Oct. 13, 1997 and entitled "Electronic Components Incorporating Ceramic-Metal Composites" by Ritland, et al., now U.S. Pat. No. 6,143,421, is a continuation-in-part based on, among others, U.S. Pat. No. 5,614,043. Each of U.S. Pat. No. 5,614,043 and U.S. patent application Ser. Nos. 08/820,164 and 08/949,227, now U.S. Pat. No. 6,143,421, are incorporated by reference herein in their entirety.

There exists a need for a method that is useful for forming high-conductivity vias, conductor paths, ground planes and other components on insulating substrates. It would be desirable for the vias to be filled with a highly conductive material, such as silver or copper. It would be advantageous if vias could be easily formed having a high conductivity metal. It would be advantageous if the components could be sintered and/or at least partially fired in a non-reducing atmosphere. It would also be advantageous if an efficient and flexible production process could be used to form the components.

SUMMARY OF THE INVENTION

According to one aspect of the present invention, a product, preferably an electronic component, is provided which includes a substrate with at least one hole which extends through the substrate and a multicomponent material filling the hole. The multicomponent material includes at least two components. The first component, when melted, is capable of wetting both the substrate and the molten second component. The second component is conductive and also bonds with the first component, which bonds with the substrate. Preferably, the first component is located between the walls of the hole and the second component in order to provide effective bonding.

The substrate is preferably a ceramic material such as alumina, zirconia, aluminum nitride, beryllia, silicon carbide, magnesia, silicon nitride and mullite. The first component is preferably a metal oxide such as a copper oxide and the second component is preferably a conductive material such as silver or copper.

The hole or holes in the substrate are preferably from about 2 mils to about 50 mils in diameter and can have any suitable cross sectional geometry such as round, oval, slotted, star-shaped, chevron, polygonal and irregular. The substrate is preferably from about 3 mils to about 60 mils in thickness and the ratio of the thickness of the substrate and the average diameter of the holes in the substrate is preferably from about 0.5:1 to about 50:1. Preferably the first component is from about 0.5 mole percent to about 25 mole percent of the total amount of the multicomponent material. In a preferred embodiment at least one surface of the product is treated to provide a flat, smooth surface.

According to another embodiment of the present invention, a method for making a substrate with filled holes is provided that includes the steps of providing a substrate having at least one hole in it, placing a material in the hole and firing the resulting assembly. When the assembly is fired, the material forms a system of two immiscible liquids. The first liquid is capable of wetting both the substrate and the second liquid. Upon solidification the first liquid forms a first component and the second liquid forms a second component. The first component forms an effective bond with the substrate and the second component bonds to the first component. In this way a stable filled via is provided.

Preferably the substrate is provided by producing a sintered ceramic material such as sintered alumina, zirconia, aluminum nitride, beryllia, silicon carbide, magnesia, silicon nitride and mullite. The hole or holes can be formed in the substrate prior to or subsequent to sintering. For example, holes can be formed when the substrate is in a green state using a punch and die, by drilling, or by providing sacrificial filler which escapes during sintering, leaving the desired holes. Alternatively, the holes can be provided in the sintered substrate by drilling, either mechanically or with a directed energy beam such as a laser. Preferably the holes are from about 2 mils to about 50 mils in diameter and the cross-sectional geometry can include any desired shapes such as round, slotted, oval, star-shaped, chevron, polygonal and irregular.

Preferably the material that is placed in the hole prior to firing is a solid member in the form of a wire. The wire can initially be two components such as copper-clad silver wire or can be a single component such as copper wire. During firing one component, e.g., copper, can be oxidized at least partially, to form the first component. In these preferred embodiments the silver or remaining copper would be the second component. Preferably, the solid member, e.g., wire, is inserted into the holes in an automated manner. For example a device can be used to place the wire in the holes and when the desired amount of wire is in the hole, the wire can be automatically cut and retained within the hole.

In an alternative embodiment, the material which is placed in the hole prior to firing can be a molten material. In a preferred embodiment the molten material is copper or a copper/silver mixture. The copper can be at least partially oxidized by heating in an oxidizing atmosphere to obtain copper oxide which, in its molten state will wet the substrate and the second liquid (e.g., copper or silver). In one embodiment, the molten material is inserted into the holes using capillary action. The walls are brought into contact with the molten material, either directly by placing a surface of the substrate against a surface of the molten material or indirectly using tubes or transfer devices. This insertion of the molten material into the substrate is considered part of the firing step because it is conducted at a temperature above the melting point of the material. Thus, the insertion of the molten material and the firing can occur simultaneously.

DESCRIPTION OF PREFERRED EMBODIMENTS

The present invention is directed to a method for making a substrate that includes filled holes, or vias, that are useful for conducting electricity and/or heat. Such substrates can advantageously be used in electronic devices having conductive vias and conductor paths connecting the vias. Examples of such electronic devices include thick film devices, thin film devices and hybrid circuit devices.

In a broad aspect, the present invention relates to fabricating substrates having holes passing through the substrates. The holes can be efficiently and effectively filled with a conductive material using the process of the present invention. In particular, a material is placed in the hole and the assembly is subjected to temperatures above the melting point of the solid. Upon melting, a two liquid system is formed. The first liquid is capable of wetting both the substrate and the second liquid and preferentially migrates to the boundary area between the wall of the substrate and the second liquid. Upon solidification the first liquid forms a first component and the second liquid forms a second component. One component is selected based on its ability to wet the ceramic in its molten state and effectively bond thereto. The other component is selected for desirable conductive properties. In a preferred embodiment the first component is transformed during firing from a metal to a metal oxide. Certain metal oxides, e.g., copper oxides, have been found to be especially suitable for wetting substrates, and in particular, ceramic substrates.

One embodiment of the process of the present invention includes the steps of providing a substrate with holes in it, providing a material in either solid or molten form, inserting the material into a hole and firing the assembly. Upon firing, the material includes at least two components. The first component is a material capable of wetting both the substrate and the second component. Preferably, the material includes copper which is converted to copper oxide during firing. It is the copper oxide which wets the substrate and the second component. Preferably, the second component is a conductive metal such as silver. Preferably, the material is provided in the form of a wire which can be inserted into the hole and cut to the appropriate length, either before or after insertion.

In an alternative embodiment of the present invention, a copper oxide/copper system can be employed in the via. Preferably, prior to firing the material consists mostly of copper. An initial low temperature firing below the melting point of copper, for example in the temperature range of 200° C. to about 500° C., is conducted in an oxidizing atmosphere. This will convert a portion of the copper to copper oxide (e.g., CuO and/or $Cu_2O$). The oxidizing atmosphere is then purged (i.e., with an inert gas such as argon, nitrogen, etc.) and the copper oxide/copper system is heated to above the melting point, preferably at least about 1218° C., more preferably at least about 1250° C. and more preferably at least about 1300° C. Preferably the temperature is kept under about 1350° C. A two liquid system is formed which includes molten copper oxide and molten copper. Because the molten copper oxide wets both the molten copper and the ceramic substrate, the molten copper oxide will preferentially migrate to the area located between the copper and the substrate. Capillary action will maintain the liquid system within the via. The copper oxide will provide for good bonding between the substrate and the conductive copper. Typically, copper-rich oxide (i.e., $Cu_2O$) forms when the copper oxide/copper system is at a temperature above the melting temperature. Therefore the first component can be $Cu_2O$ and the second component can be metallic copper which is a good thermal and electrical conductor.

Useful applications of the process include forming electrically conductive vias in insulating substrates and forming electrically conductive vias which are connected to a ground plane in an insulating substrate.

Further processing of the assembly can take place, such as smoothing or polishing one or more surfaces, applying electrical pads to the filled holes and electrically interconnecting selected vias to form a desired circuit pattern.

According to one embodiment of the present invention, ceramic substrates are formed having copper oxide/silver composite vias. According to another embodiment of the present invention ceramic substrates are formed having copper oxide/copper composite vias.

In a preferred embodiment of the process of the present invention, copper is initially placed in the holes with the intent of converting the copper to copper oxide. During firing the copper can be oxidized to copper oxide (e.g., CuO and/or $Cu_2O$). In a copper oxide/silver system the copper can be partially or completely oxidized. Typically the copper oxide in the copper oxide/silver system will be in the oxygen-rich form (e.g., CuO). In the copper oxide/copper system, the copper is partially oxidized and then the remainder of the firing takes place in an nonoxidizing (e.g., inert) atmosphere in order to maintain the desired ratio of copper oxide to copper. Typically in the copper oxide/copper system the copper oxide will be in the form of copper-rich oxide (e.g., $Cu_2O$). Such vias can be useful for electrical conduction or heat conduction.

According to the present invention, the substrate is preferably a ceramic material. The ceramic can be selected from virtually any ceramic useful for forming ceramic sheets used in electronic components. For example, the ceramic material can be selected from alumina ($Al_2O_3$), zirconia ($ZrO_2$), aluminum nitride (AlN), beryllia (BeO), silicon carbide (SiC), magnesia (MgO), silicon nitride ($Si_3N_4$) and mullite ($3Al_2O_3.2SiO_2$), or other ceramic materials. A wide variety of additives can also be included in the substrate material, if desired. According to the present invention, a preferred ceramic material is alumina since alumina is a common ceramic for use as a substrate material. As is known to those skilled in the art, alumina can also include sintering aids, such as silica ($SiO_2$).

In addition to polycrystalline ceramics, as discussed hereinabove, glass-ceramics or glasses can also be used to form substrates. Glass-ceramic and glass compositions can be tailored to fit a variety of needs and are typically capable of being sintered at lower temperatures than traditional oxide or non-oxide ceramics.

A ceramic substrate can be formed by any of a number of processes that are useful for forming ceramic substrates. Ceramic substrates used in the production of electronic devices are commonly formed by a tape casting process. The tape casting process includes the steps of casting a slurry onto a moving carrier surface, such as cellulose acetate, teflon, mylar or cellophane, and spreading the slurry to a controlled thickness with the edge of a blade. The cast slurry is then dried, resulting in a thin, flexible tape that can be cut or stamped to a desired configuration, such as square sheets.

Additives are typically introduced into the slurry prior to casting to control the properties of the final tape. For example, deflocculants, solvents, binders and plasticizers may be added to the ceramic material to provide desirable flexibility and handling properties of the cast tape.

Although tape casting is a preferred method of fabrication, other methods for forming the ceramic substrates may be utilized in accordance with the present invention. For example, individual ceramic substrates may be dry pressed or a plastic ceramic body can be extruded through a narrow die to form a ceramic substrate. Ceramic tape can also be manufactured by a roll compaction process wherein a powder/binder mixture is fed through rollers having the desired gap between the rollers for thickness control.

The holes can be formed in the ceramic substrate before or after the ceramic substrate has been sintered. For example, the vias can be mechanically punched into the green ceramic sheet. The size of the via in the ceramic sheet is controlled by the size of the male punch and the female die opening. Most vias are round, since this is the lowest stress form and the least expensive punch to manufacture. Alternatively, other via cross-sectional shapes may be used, such as oval, slotted, star-shaped, polygonal, chevron and irregular. The male punch is usually a "bed of nails" type made up of rods or punch pins extending from a planar surface, and having the desired shape, diameter and location. The female die is a planar surface with holes matching the location of the male punch pins. The holes in the female punch are slightly larger than the male punches to provide alignment and clearance tolerances.

To fabricate a via pattern the die is opened, a sheet of ceramic tape is inserted between the die blocks and the male array of punches is forced through the tape, fracturing the tape and pushing slugs of tape into the female die.

Alternatively, other techniques may be employed to place the holes in the green substrate before or during sintering. For example, holes can be drilled into the green substrate or placed therein by other mechanical means. Holes may also be formed in the green substrate using a laser or other directed energy beam. Alternatively, sacrificial materials can be placed within the substrate which are volatilized during sintering, leaving the desired hole in the fired substrate.

After sintering, the ceramic tape will therefore include at least one, and preferably a plurality of holes. Because the size and location of the hole can change during sintering, it is desirable to select a size and location of hole in the green substrate which will result in the desired hole size and location after sintering.

After a green body is formed, the green body is then sintered in a sintering furnace. For example, an alumina green sheet is typically sintered at from about 900° C. to about 1800° C. to densify the ceramic. The sintering step can also include a binder burnout phase wherein organics are volatilized from the green body. However, the sintering temperature according to the present invention can advantageously be somewhat lower than the sintering temperatures typically used for green bodies since there is no refractory metal to be co-fired with the body. Further, the amount of organic that needs to be burned out of the system is reduced due to the lack of refractory metal paste. An additional advantage of the present invention is that the sintering does not require a reducing atmosphere, as is required when using refractory metal paste. Thus, the green body can advantageously be sintered in air.

The holes in the substrate can be formed before sintering, as described above or after sintering. One advantage of forming the holes after sintering is that the sintered substrate is relatively stable and therefore the size and location of the holes is relatively easy to control. The holes can be formed by any suitable method. For example the holes can be formed by mechanical drilling using appropriate size bits. However, the cross-sectional geometry of drilled holes is limited.

Figure 2:
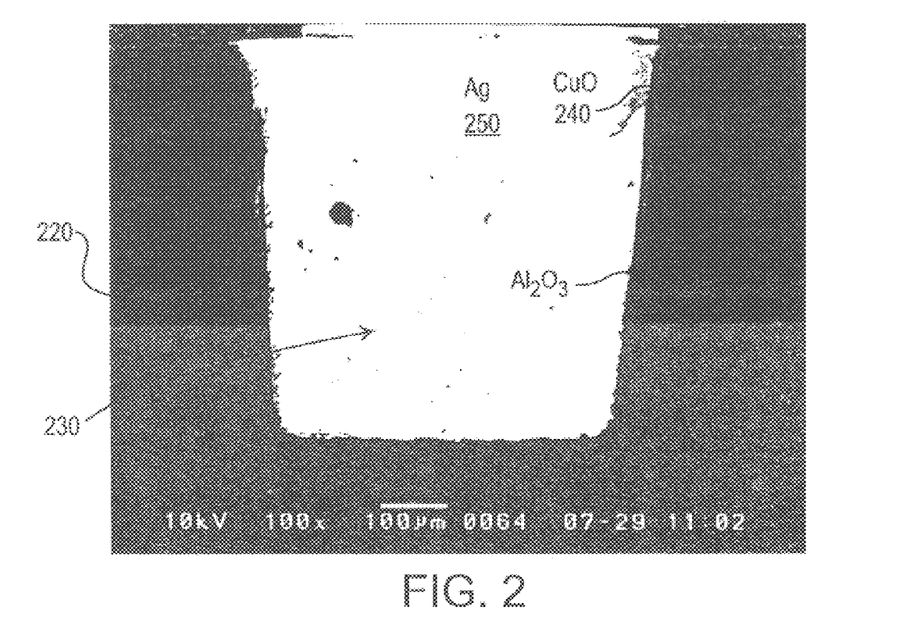
FIG. 2 illustrates the cross-section of a filled via according to an embodiment of the present invention.

In a preferred embodiment, the holes are formed by a laser, e.g., a $CO_2$ laser or an excimer laser. A typical $CO_2$ laser will form a substantially cylindrical or conical (i.e., having a circular cross section) hole having a diameter of approximately 3 mils and a typical excimer laser will form a substantially cylindrical or conical hole having a diameter of approximately 2 mils. Typically, larger holes are desired and can easily be formed by using a laser to make multiple holes in the correct geometric configuration to obtain the desired hole size. For electrically conductive vias a typical hole may be in the range of from about 5 mils to about 7 mils. For thermally conductive vias a typical hole size can be about 20 mils, although larger and smaller holes and holes of different geometric configurations can also be employed in the present invention. The wall of the hole does not have to be perpendicular to the surface of the substrate. For example, the hole can be conical, as shown in FIG. 2.

In one embodiment the laser can be fixed in place and a moveable table can support the substrate and move it in X and Y directions in order to obtain the desired size, shape and number of holes. Alternatively, mirrors can be used to direct the laser beam as desired. A laser beam can also be split, using refractive and/or reflective devices, and directed to multiple substrates or to form multiple holes in a single substrate simultaneously. Typically the substrates are 3 to 60 mils in thickness. Aspect ratios (i.e., the ratio of the thickness of the substrate to the average diameter of the holes) can vary widely. For example an aspect ratio of from about 0.5:1 to an aspect ratio of about 50:1 can be effectively formed. Typical aspect ratios will be in the range of 1:1 to 5:1. Extremely small diameter holes can be formed, as long as the filler material (e.g., solid wire or molten material) can be handled and inserted in the holes during production.

Although round holes are preferred, slots, ovals, star-shapes, polygons, chevrons and irregular-shaped holes can also be used. For example, with microwave applications, slots and ovals work well because the microwaves will interact with the vias depending on their size. Thus the geometry of the hole can be designed to obtain the desired level of interaction between the microwaves and the vias.

As used herein, the term "diameter" generally refers to the average diameter of a substantially round hole. However because the present invention is not limited to holes having a uniform round cross-sectional geometry (i.e., cylinders), the term diameter will be understood to mean the diameter of a right cylinder which displaces the same volume as the volume of the hole in question. In other words, for a square hole, a slot, an oval hole, a conical hole, etc., the volume is determined for the hole. The diameter of a right cylinder having the same height as the noncylinderical-shaped hole which displaces the same volume will be calculated to determine the "diameter" of the non-cylindrical hole.

After the holes have been formed in the substrate, it is necessary to place into the hole the material which will become the two component solid in the filed via. In a preferred embodiment the material is placed into the hole as a solid, then melted and finally solidified in its final two component form. However, it is also possible to place the material into the hole in a molten liquid form. For example, during the firing stage the molten material can be wicked into the holes by capillary action. However, due to the simplicity of handling and the potential for automation, it is preferred that the material be placed in the hole in a solid form, then melted. When initially placed in the hole, the material may be a single component (e.g., copper) or dual components (e.g., copper/silver, copper oxide/silver and copper oxide/copper). No matter what form the material is when it is initially placed in a hole, when the finished product is produced, there must be at least two components. A high conductivity metal is referred to herein as the second component. In addition, a first component must be present in the finished product. When melted, the first component and second component form an immiscible two liquid system. The first liquid is capable of wetting both the substrate and the second liquid and therefore preferentially migrates to an area between the substrate and second liquid. The second component should not take oxygen from the first component, if the first component is an oxide. The two components should also melt at a reasonable temperature, such as between 800° C. and 1500° C. An example of a suitable first component is copper oxide (e.g., CuO and $Cu_2O$). Although the copper oxide can be present in the two component system at the beginning of assembly of the product, it is preferred to form the copper oxide in situ by processing, preferably at an elevated temperature, the material in an oxidizing (including partially oxidizing) atmosphere, thus forming suitable amounts of copper oxide.

Figure 1:
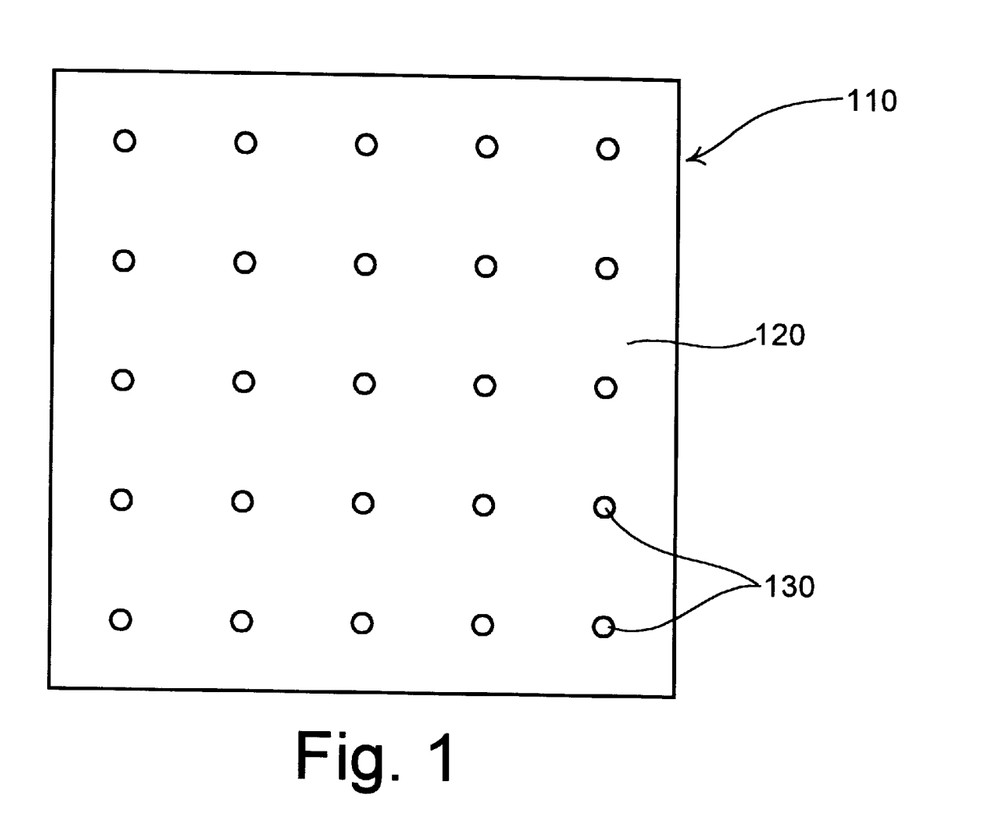
FIG. 1 illustrates a ceramic substrate having a plurality of filled vias according to an embodiment of the present invention.

A simple product according to this aspect of the present invention is illustrated in FIG. 1. The product 110 includes a ceramic substrate 120 having a plurality of vias 130 formed in the substrate 120 on a grid. The vias 130 are filled with a two component system which provides good adhesion to the substrate as well as good conductivity. In one preferred embodiment the two component system includes silver and copper oxide. In an alternative preferred embodiment, the two component system includes copper and copper oxide. Vias on a grid such as that illustrated in FIG. 1 are useful for electrical interconnection between various locations of a ceramic device.

Figure 3:
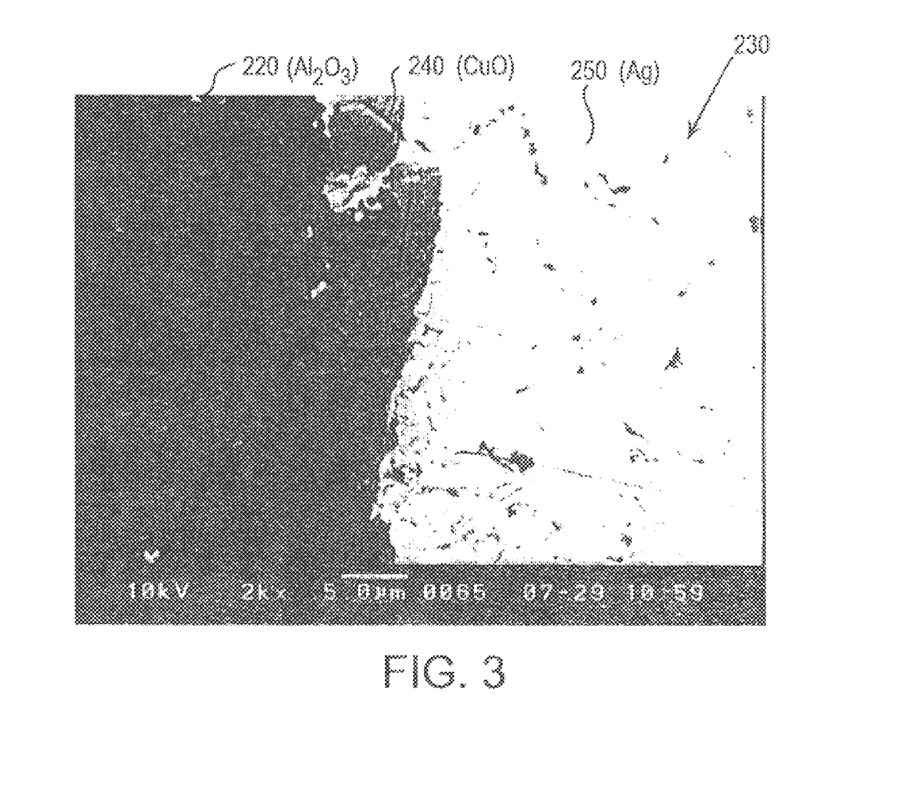
FIG. 3 illustrates a close-up view of the cross-section of a filled via according to an embodiment of the present invention.

FIG. 2 illustrates a closeup and cross section of a via according to the present invention. The ceramic sheet 220 has a via 230 formed in the ceramic sheet. The via includes a first component 240 located adjacent the walls of the via and a second component 250 which is located in the center of the via. During the manufacture of the product, a two liquid system is formed by melting the first and second components. Because the molten first component can wet both the substrate and the molten second component it preferentially migrates to the via wall where it solidifies and provides good bonding between the substrate 220 and the second component 250. The dark band located at the top and bottom of the via 230 in FIG. 2 is the material used to hold the cross-section in place while the photomicrograph is taken. FIG. 3 is a close-up view of a via of the type shown in FIG. 2, using the same numbers to refer to like components. FIG. 3 better illustrates the first component 240, which is copper oxide in FIG. 3.

To improve bonding between the ceramic and the first component, it may be desirable to modify the wetting or spreading characteristics of the ceramic and first component. One way to do this is to coat the ceramic with a coating that is more easily wetted by the molten metal. After one or more of surface modifications or chemical alterations, if necessary, the molten first component will wet the ceramic and provide good bonding when solidified.

An example of an effective bond between the solid via filler material and the substrate is if, when the filled via is cut to expose a lateral surface of the solid filling, the remaining portion of the solid filling remains within the via. This occurs when it is desired to have conductive pathways along the edge of a component. In this instance a filled via would be produced in the interior of a substrate and then the substrate would be cut in order to expose the solid filling along the edge. With the present invention the solid filling remains within the via and does not fall out, as was the case with certain prior art filled vias.

During or after insertion of the material into the hole, firing of the assembly takes place. The temperature at which firing takes place is dependent on the ceramic and the desired final two components. For example, for an alumina ceramic with vias filled with a copper oxide/silver system, the firing preferably takes place at a temperature range of from about 960° C. to about 1200° C., more preferably from about 970° C. to about 1100° C. and more preferably from about 975° C. to about 1025° C. For an alumina ceramic having vias filled with a copper oxide/copper system firing preferably takes place from about 1218° C. to about 1350° C., more preferably from about 1250° C. to about 1350° C. and more preferably from about 1300° C. to about 1350° C. The total time required for firing is typically less than about 1 hour at the maximum firing temperature. Preferred firing times at the maximum temperature are from about 1 minute to about 60 minutes, preferably from about 1 minute to about 30 minutes and more preferably from about 5 minutes to about 20 minutes.

In a preferred embodiment, the process of the present invention includes forming a wire for use as the material which is inserted into the hole. Preferably the core of the wire is formed of a conductive material (e.g., either electrically or thermally conductive or both). In one embodiment, the conductive material can then be coated with a second material. A preferred coating technique is electrolytic coating although other coating techniques can also be used. Importantly, the coating material, when processed, must form an effective bond with the substrate material which forms the walls of the via. This two component wire is then placed in the holes in the substrate and fired to efficiently form conductive vias which are well bonded to the substrate material. Preferably the core of the wire is formed by a conductive material such as silver and the coating is formed from copper. When processed in an oxidizing atmosphere such as air the copper will oxidize and form copper oxide. The copper oxide is an excellent material to wet and effectively bond with a substrate, and in particular a ceramic substrate. The copper oxide also forms a good bond with the silver thus retaining the conductive material in the via. Alternatively, the wire can initially be made of pure copper or substantially of pure copper. Although pure copper is an effective conductor, when oxidized it is much less effective as a conductor. Therefore, the copper wire is only partially oxidized during a low temperature firing step in an oxidizing atmosphere. The oxidizing atmosphere is then removed and the two component wire is then fired above its melting point. The copper oxide forms the first component when solidified and the copper core forms the second component when solidified.

Typical final mole percentages of copper oxide ranges from about 0.5 to about 25 percent preferably 0.5 to 15 mole percent and more preferably from about 1 to about 5 mole percent. In addition to coating, alloys of the two components can be used. If a copper/silver alloy is used as the wire, the copper oxide which is formed during firing in an oxidizing atmosphere can migrate to the interface between the substrate and the conductive material.

Figure 4:
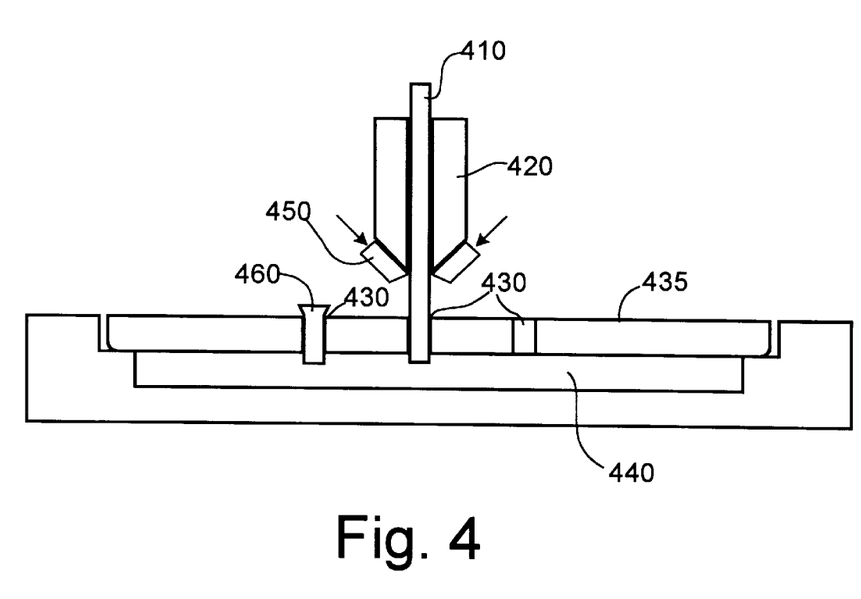
FIG. 4 illustrates a device for inserting a wire into a hole in a substrate.

The two component member can be inserted in the hole in any suitable manner. A particularly effective technique is to form the two component member into a wire and insert the wire into the hole. Once inserted it can be cut to the desired length. As shown in FIG. 4, a preferred embodiment of the insertion process is to meter the wire 410 through a device 420 which places the wire 410 into the hole 430 in the substrate 435. A conductive backstop 440 can be used at the distal end of the hole 430 which, when touched by the wire 410 inserted into the hole 430, completes a circuit, causing the wire to be cut by cutter 450. A cut portion of wire 460 is shown having a deformed top which helps retain the cut wire 460 in the hole 430. The support table 470 can be x-y table which moves to position the hole 430 underneath the metering device 420. The same type table can be used during the formation of the holes 430. Alternatively, the metering device 420 can move. Alternative methods of actuating the cutting of the wire can also be employed. For example, the wire can be cut when a predetermined length is inserted into the hole, after a predetermined period of time or after a sensor is activated, according to a sequencing device or a capacitance device. In this way, the insertion and cutting process can be highly automated.

The wire can be completely contained within the hole or extend out of the hole on one or both ends. It is desired to provide enough wire material to completely fill the hole, but it is typically not desired to have excess form a bump or extension at the surface, however a slight recess can be acceptable. In certain embodiments, however, a bump can be acceptable. Alternatively, the surface can be treated by a smoothing process, such as lapping and polishing to obtain a desired flat, smooth, planar surface geometry.

Preferably, the ceramic is sintered prior to inserting the material. Sintering the ceramic first provides a number of advantages. For example, the ceramic sintering temperature is typically higher than the temperature desired for firing the assembly having the material in the hole. Additionally, during sintering of the ceramic the holes will change size and location due to shrinkage of the ceramic, which can be hard to control.

Once the material has been inserted into the hole, the assembly is fired in order to melt the material. Preferably this is done in an oxidizing atmosphere, such as air, so that the first component can oxidize prior to melting. It has been discovered that oxidized materials wet the ceramic better than nonoxidized materials, thus allowing for the formation of a fully dense and well integrated filled via. The firing can be done in a batch or continuous furnace. Preferably, the portion of the assembly where the holes are located is not contacted by any object, so that they are free hanging during firing. Examples of suitable firing temperatures are from about 200° C. to about 500° C. for oxidizing the material and from about 960° C. to 1200° C., preferably from 970° C. to about 1100° C. and more preferably from about 975° C. to about 1025° C. for melting the silver system and from about 1218° C. to about 1350° C. for melting the copper system. Appropriate firing times will depend on the temperature but typically are from about 1 to about 60 minutes, preferably from about 1 to about 30 minutes and more preferably from about 5 to about 20 minutes, at the minimum temperature.

After the vias are formed, they can be covered with a conductive pad. Circuits can then be provided from pad to pad. Because the vias of the present invention can be formed with extremely small diameters, a smaller pad is needed to cover the end of the via. Smaller pads naturally take up less space and leave a greater amount of room for circuitry. This is important in the formation of extremely small or dense electronic components.

In another embodiment of the present invention, planar conductor paths are also formed on the ceramic substrate. In this instance, a conductive material is applied onto the surface of the ceramic substrate in a pattern that corresponds to the desired pattern for interconnecting vias and other portions of the ceramic sheet.

The infiltrated via process results in excellent bonding between the metal via and the ceramic substrate. Irregularities on the ceramic surface due to laser drilling actually improve the via bonding. The filled vias are hermetic and dense. Pull strengths greater than 10 kpsi have been repeatedly demonstrated. Failure is observed at the soldered pin with no failure at the via/substrate interface and no reduction in hermeticity. The infiltration process used to fabricate filled vias allows the formation of hermetic vias with no internal voids at diameters less than 0.010 inch. The limiting factor for via size is generally the method for creating the via hole in the substrate. Irregular geometries can be formed. Filled slots can offer significant design flexibility, especially in terms of vias that terminate at the substrate edge. Both silver and copper offer excellent properties in regards to their low electrical resistivities and high thermal conductivities. Extremely high length/diameter aspect ratio vias are readily formed. The process of the present invention offers the potential for hermetic, low thermal and electrical resistance interconnection pathways through large dimension ceramic components.

While various embodiments of the present invention have been described in detail, it is apparent that modifications and adaptations of those embodiments will occur to those skilled in the art. However, it is to be expressly understood that such modifications and adaptations are within the spirit and scope of the present invention.

What is claimed is:

1. A process for producing a product, said process comprising:
   a) providing a substrate having at least one hole passing through said substrate, wherein said substrate comprises a sintered ceramic material;
   b) inserting a material into said hole; and
   c) firing the assembly in order to form a two liquid system, wherein a first liquid wets both said substrate and a second liquid and said first liquid migrates to a boundary area within said hole between said substrate and said second liquid and upon solidification said first liquid forms a first component and said second liquid forms a second component, wherein said first component forms an effective bond with said substrate and wherein said second component effectively bonds to said first component.

2. The process as claimed in claim 1 wherein said substrate comprises a ceramic material selected from the group consisting of alumina, zirconia, aluminum nitride, beryllia, silicon carbide, magnesia, silicon nitride and mullite.

3. The process as claimed in claim 1 wherein said hole is formed in said substrate using a laser.

4. The process as claimed in claim 1 wherein said hole is formed in said substrate using a carbon dioxide laser or an excimer laser.

5. The process as claimed in claim 1 wherein said hole is formed in said substrate by outlining the shape of said hole using a laser to form a hole larger than the beam of said laser.

6. The process as claimed in claim 1 wherein said hole is formed in said substrate using a laser beam to outline a shape selected from the group consisting of round, slotted, oval, star-shaped, chevron, polygonal and irregular.

7. The process as claimed in claim 1 wherein said hole is formed in said substrate using a fixed laser and by moving said substrate in order to form the desired pattern.

8. The process as claimed in claim 1 wherein a plurality of holes are formed in said substrate.

9. The process as claimed in claim 1 wherein said hole is formed in said substrate by maintaining said substrate in a fixed position and moving a laser beam in a desired pattern using a reflective device.

10. The process as claimed in claim 1 wherein said hole is formed in said substrate using a laser beam which is split into multiple beams using reflective and/or refractive devices in order to form more than one hole at a time.

11. The process as claimed in claim 1 wherein said hole is formed when said substrate is in a green state.

12. The process as claimed in claim 1 wherein said hole is formed when said substrate is in a green state by using a punch and die to form said hole.

13. The process as claimed in claim 1 wherein said hole is formed in said substrate using a drill.

14. The process as claimed in claim 1 wherein said material has a size and geometry such that when it is inserted into said hole, it remains therein.

15. The process as claimed in claim 1 wherein said assembly is fired at a temperature of from about 960° C. to about 1350° C.

16. The process as claimed in claim 1 wherein said assembly is fired at a temperature of from about 960° C. to about 1200° C. and wherein said second component is silver.

17. The process as claimed in claim 1 wherein said assembly is fired at a temperature of from about 1218° C. to about 1350° C. and wherein said second component is copper.

18. The process as claimed in claim 1 wherein said assembly is fired for a period of time from about one minute to about sixty minutes.

19. The process as claimed in claim 1 wherein said assembly is fired for a period of time from about one minute to about thirty minutes.

20. The process as claimed in claim 1 wherein said assembly is fired for a period of time from about five minutes to about twenty minutes.

* * * * *